(12) United States Patent
Yang et al.

(10) Patent No.: US 11,990,414 B2
(45) Date of Patent: May 21, 2024

(54) BEOL ALTERNATIVE METAL INTERCONNECTS: INTEGRATION AND PROCESS

(71) Applicant: International Business Machines Corporation, Armonk, NY (US)

(72) Inventors: Chih-Chao Yang, Glenmont, NY (US); Theo Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 276 days.

(21) Appl. No.: 17/115,160

(22) Filed: Dec. 8, 2020

(65) Prior Publication Data
US 2021/0091010 A1 Mar. 25, 2021

Related U.S. Application Data

(62) Division of application No. 15/912,089, filed on Mar. 5, 2018, now Pat. No. 10,886,225.

(51) Int. Cl.
*H01L 23/48* (2006.01)
*H01L 21/768* (2006.01)
*H01L 23/522* (2006.01)
*H01L 23/525* (2006.01)
*H01L 23/532* (2006.01)

(52) U.S. Cl.
CPC .. *H01L 23/53252* (2013.01); *H01L 21/76807* (2013.01); *H01L 21/76843* (2013.01); *H01L 21/76864* (2013.01); *H01L 23/5226* (2013.01); *H01L 23/5256* (2013.01); *H01L 23/53238* (2013.01)

(58) Field of Classification Search
CPC ........... H01L 23/53252; H01L 23/5226; H01L 23/5256; H01L 23/53238
See application file for complete search history.

(56) References Cited

U.S. PATENT DOCUMENTS

| | | |
|---|---|---|
| 5,262,354 A | 11/1993 | Cote et al. |
| 5,948,700 A | 9/1999 | Zheng et al. |
| 6,323,554 B1 | 11/2001 | Joshi et al. |
| 6,599,828 B1 | 7/2003 | Gardner |
| 6,979,625 B1 | 12/2005 | Woo et al. |
| 7,544,992 B2 | 6/2009 | Shih et al. |
| 8,772,156 B2 | 7/2014 | Hsu et al. |

(Continued)

OTHER PUBLICATIONS

List of IBM Patents or Patent Applications Treated as Related dated Dec. 8, 2020, 2 pages.

*Primary Examiner* — Hoa B Trinh
(74) *Attorney, Agent, or Firm* — Scully, Scott, Murphy & Presser, P.C.; Kelsey M. Skodje (57) ABSTRACT

Back-end-of-the line (BEOL) interconnect structures are provided in which an alternative metal such as, for example, a noble metal, is present in a combined via/line opening that is formed in an interconnect dielectric material layer. A surface diffusion dominated reflow anneal is used to reduce the thickness of a noble metal layer outside the combined via/line opening thus reducing or eliminating the burden of polishing the noble metal layer. In some embodiments and after performing the anneal, a lesser noble metal layer can be formed atop the noble metal layer prior to polishing. The use of the lesser noble metal layer may further reduce the burden of polishing the noble metal layer.

9 Claims, 7 Drawing Sheets

(56) References Cited

U.S. PATENT DOCUMENTS

| | | | |
|---|---|---|---|
| 8,796,853 B2 | 8/2014 | Yang et al. | |
| 8,889,491 B2 | 11/2014 | Filippi et al. | |
| 8,916,461 B2 | 12/2014 | Bao et al. | |
| 9,059,170 B2 | 6/2015 | Bao et al. | |
| 9,129,964 B2 | 9/2015 | Coyner et al. | |
| 2006/0118963 A1* | 6/2006 | Yamada | H01L 23/53238 |
| | | | 257/784 |
| 2007/0224801 A1* | 9/2007 | Yang | H01L 21/76846 |
| | | | 438/618 |
| 2007/0249156 A1 | 10/2007 | Bonilla et al. | |
| 2008/0296728 A1* | 12/2008 | Yang | H01L 23/5252 |
| | | | 257/E21.585 |
| 2009/0169760 A1 | 7/2009 | Akolkar et al. | |
| 2010/0155949 A1 | 6/2010 | Jain | |
| 2014/0220777 A1 | 8/2014 | Yang et al. | |
| 2017/0170062 A1 | 6/2017 | Murray et al. | |
| 2019/0229264 A1 | 7/2019 | Karpov et al. | |

\* cited by examiner

BEOL ALTERNATIVE METAL INTERCONNECTS: INTEGRATION AND PROCESS

BACKGROUND

The present application relates to back-end-of-the-line (BEOL) technology. More particularly, the present application relates to BEOL interconnect structures including alternative metals and methods of forming the same.

Generally, BEOL interconnect devices include a plurality of circuits which form an integrated circuit fabricated on a BEOL interconnect substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures.

Within typical BEOL interconnect structures, electrically conductive metal vias run perpendicular to the BEOL interconnect substrate and electrically conductive metal lines run parallel to the BEOL interconnect substrate. Typically, the electrically conductive metal vias are present beneath the electrically conductive metal lines and both features are embedded within an interconnect dielectric material layer.

In conventional BEOL interconnect structures, copper or a copper containing alloy has been used as the material of the electrically conductive metal vias and lines. In recent years, advanced dual damascene interconnect structures containing a combined electrically conductive via/line feature have been developed in which an alternative metal such as, for example, ruthenium or other noble metals, has been used instead of copper or a copper alloy in the electrically conductive via only, or in both the electrically conductive via and electrically conductive line. In instances in which a noble metal layer is provided to a combined via/line opening that is present in an interconnect dielectric material layer, the overburden portion of noble metal layer that is located outside the combined via/line opening is difficult to remove since noble metals have a slow polishing rate. As such, macro-to-macro variation and/or center-to-edge variation is typically observed in BEOL interconnect structures that contain a noble metal within a combined via/line opening.

There is thus a need for providing advanced dual damascene interconnect structures in which an alternative metal (i.e., a noble metal) can be used while reducing or eliminating the polishing issue mentioned above.

SUMMARY

Back-end-of-the line (BEOL) interconnect structures are provided in which an alternative metal such as, for example, a noble metal, is present in a combined via/line opening that is formed in an interconnect dielectric material layer. A surface diffusion dominated reflow anneal is used to reduce the thickness of a noble metal layer outside the combined via/line opening thus reducing or eliminating the burden of polishing the noble metal layer. In some embodiments and after performing the anneal, a lesser noble metal layer can be formed atop the noble metal layer prior to polishing. The use of the lesser noble metal layer may further reduce the burden of polishing the noble metal layer.

In one aspect of the present application, a back-end-of-the line (BEOL) interconnect structure is provided. In one embodiment, the BEOL interconnect structure includes a first metal structure composed of a noble metal that is present in a combined via/line opening of an interconnect dielectric material layer. A second metal structure composed of a metal that is less noble than the noble metal is present in an upper portion of the combined via/line opening and is in direct physical contact with the first metal structure. In accordance with the present application, a portion of the first metal structure is located on each sidewall surface of the second metal structure.

In another embodiment of the present application, the BEOL interconnect structure includes a metal structure composed of a noble metal present in a combined via/line opening that is present in a lower interconnect dielectric material layer, wherein the metal structure has fuse elements that are present above a topmost surface of the lower interconnect dielectric material layer. An upper interconnect dielectric material layer is located above the lower interconnect dielectric material layer. The upper interconnect dielectric material layer includes a fuse element contact structure contacting each fuse element and a non-fuse element contact structure contacting a surface of the metal structure that is located in the combined via/line opening present in the lower interconnect dielectric material layer.

In other aspect of the present application, a method of forming a BEOL interconnect structure is provided. In one embodiment, the method includes providing a combined via/line opening in an interconnect dielectric material layer. A first metal layer composed of a noble metal is deposited in the combined via/line opening and above a topmost surface of the interconnect dielectric material layer. A reflow anneal is performed to reflow the first metal layer and to provide a first metal layer portion in the combined via/line opening, wherein a portion of the first metal structure layer portion extends above the topmost surface of the interconnect dielectric material. A second metal layer composed of a metal that is less noble than the noble metal is formed on the first metal layer portion. The second metal layer and the first metal layer portion outside the opening and above the topmost surface of the interconnect dielectric material layer are removed by planarization. A remaining portion of the first metal layer portion inside the combined via/line opening provides a first metal structure composed of the noble metal and a remaining portion of the second metal layer inside the combined via/line opening provides a second metal structure composed of the metal that is less noble than the noble metal. A portion of the first metal structure is located on each sidewall surface of the second metal structure.

In another embodiment, the method may include providing a combined via/line opening in a lower interconnect dielectric material layer. A metal layer composed of a noble metal is deposited in the combined via/line opening and above a topmost surface of the lower interconnect dielectric material layer. A reflow anneal is performed to reflow the metal layer and to provide a metal layer portion in the combined via/line opening, wherein a portion of the metal layer portion extends above the topmost surface of the lower interconnect dielectric material layer. The metal layer portion is patterned to provide a metal structure composed of the noble metal within the combined via/line opening, wherein the metal structure has fuse elements that are present above a topmost surface of the lower interconnect dielectric material layer. An upper interconnect dielectric material layer is formed above the lower interconnect dielectric material layer, wherein the upper interconnect dielectric material layer includes a fuse element contact structure contacting each fuse element and a non-fuse element contact structure contacting a surface of the metal structure that is located in the combined via/line opening present in the lower interconnect dielectric material layer.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
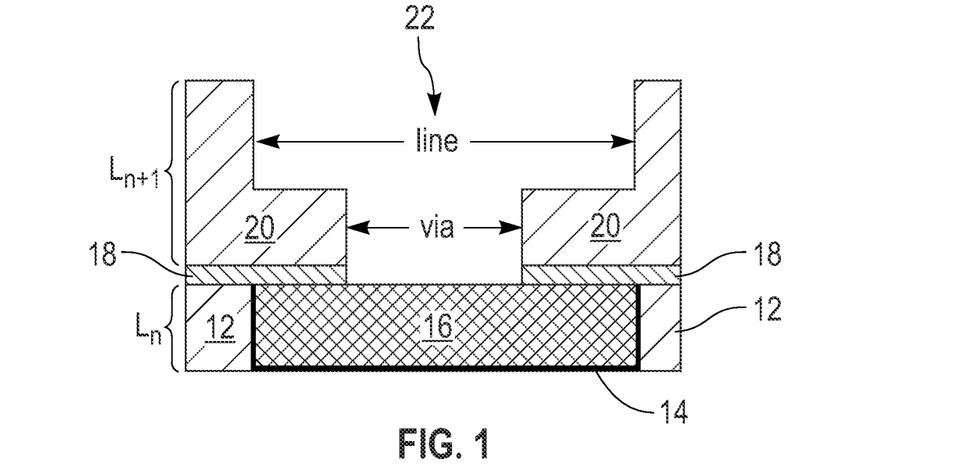
FIG. 1 is a cross sectional view of an exemplary BEOL interconnect structure of the present application during an early stage of fabrication and including a second interconnect dielectric material layer having a combined via/line opening formed therein and located above a lower interconnect level.

Referring first to FIG. 1, there is illustrated an exemplary BEOL interconnect structure of the present application during an early stage of fabrication in accordance with an embodiment of the present application. As is shown, the exemplary BEOL interconnect structure of FIG. 1 includes a second interconnect dielectric material layer 20 having a combined via/line opening 22 formed therein and located above a lower interconnect level, $L_n$. The second interconnect dielectric material layer 20 is a component of an upper interconnect level, $L_{n+1}$, wherein n is 0 or an integer starting from 1. When n is 0, the lower interconnect level, $L_n$, is omitted and replaced with a semiconductor substrate that contains a plurality of semiconductor devices formed therein or thereupon.

In the illustrated embodiment, a dielectric capping layer 18 is positioned between the lower interconnect level, $L_n$, and the upper interconnect level, $L_{n+1}$. In some embodiments, dielectric capping layer 18 is omitted.

When present, the lower interconnect level, $L_n$, includes a first interconnect dielectric material layer 12 that includes at least one first metal-containing structure 16 embedded therein; the at least one first metal-containing structure is electrically conductive. A first diffusion barrier liner 14 is also present that surrounds the sidewalls and the bottom wall (i.e., bottommost surface) of the at least one first metal-containing structure 16 which is embedded in the first interconnect dielectric material layer 12. As is shown, the first metal-containing structure 16 and the first diffusion barrier liner 14 have topmost surfaces that are coplanar with each other as well as coplanar with a topmost surface of the first interconnect dielectric material layer 12. In some embodiments, the first diffusion barrier liner 14 may be omitted from the lower interconnect level, $L_n$. In some embodiments, the first interconnect dielectric material layer 12 may extend beneath the at least one first metal-containing structure 16 so as to completely embed the at least one first metal-containing structure 16.

The first interconnect dielectric material layer 12 of the lower interconnect level, $L_n$, may be composed of an inorganic dielectric material or an organic dielectric material. In some embodiments, first interconnect dielectric material layer 12 may be porous. In other embodiments, the first interconnect dielectric material layer 12 may be non-porous. Examples of suitable dielectric materials that may be employed as the first interconnect dielectric material layer 12 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first interconnect dielectric material layer 12 may have a dielectric constant (all dielectric constants mentioned herein are measured relative to a vacuum, unless otherwise stated) that is about 4.0 or less. In one embodiment, the first interconnect dielectric material layer 12 has a dielectric constant of 2.8 or less. These dielectrics generally having a lower parasitic cross talk as compared to dielectric materials whose dielectric constant is greater than 4.0.

The first interconnect dielectric material layer 12 may be formed by a deposition process such as, for example, chemical vapor deposition (CVD), plasma enhanced chemical vapor deposition (PECVD) or spin-on coating. The first interconnect dielectric material layer 12 may have a thickness from 50 nm to 250 nm. Other thicknesses that are lesser than 50 nm, and greater than 250 nm can also be employed in the present application.

After providing the first interconnect dielectric material layer 12, at least one opening (not shown) is formed into the first interconnect dielectric material layer 12; each opening will house a first metal-containing structure 16 and, if present, the first diffusion barrier liner 14. The at least one opening in the first interconnect dielectric material layer 12 may be a via opening, a line opening and/or combined a via/lines opening. The at least one opening may be formed by lithography and etching. In embodiments in which a combined via/line opening is formed, a second iteration of lithography and etching may be used to form such an opening.

In some embodiments, a first diffusion barrier material is then formed within the at least one opening and on an exposed topmost surface of the first interconnect dielectric material layer 12; the first diffusion barrier material will provide the first diffusion barrier liner 14 mentioned above. The first diffusion barrier material may include Ta, TaN, Ti, TiN, Ru, RuN, RuTa, RuTaN, W, WN or any other material that can serve as a barrier to prevent a conductive material from diffusing there through. The thickness of the first diffusion barrier material may vary depending on the deposition process used as well as the material employed. In some embodiments, the first diffusion barrier material may have a thickness from 2 nm to 50 nm; although other thicknesses for the diffusion barrier material are contemplated and can be employed in the present application as long as the first diffusion barrier material does not entirely fill the opening. The first diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the first diffusion barrier material. In cases in which the conductive material to be subsequently and directly formed on the first diffusion barrier material, the optional plating seed layer is not needed. The optional plating seed layer is employed to selectively promote subsequent electroplating of a preselected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

A first interconnect metal or metal alloy is formed into each opening and, if present, atop the first diffusion barrier material. The first interconnect metal or metal alloy provides the first metal-containing structure 16 of the present application. The first interconnect metal or metal alloy may be composed of copper (Cu), aluminum (Al), tungsten (W), or an alloy thereof such as, for example, a Cu-Al alloy. The first interconnect metal or metal alloy can be formed utilizing a deposition process such as, for example, CVD, PECVD, sputtering, chemical solution deposition or plating. In one embodiment, a bottom-up plating process is employed in forming the first interconnect metal or metal alloy. In some embodiments, the first interconnect metal or metal alloy is formed above the topmost surface of the first interconnect dielectric material layer 12.

Following the deposition of the first interconnect metal or metal alloy, a planarization process such as, for example, chemical mechanical polishing (CMP) and/or grinding, can be used to remove all interconnect metal or metal alloy (i.e., overburden material) that is present outside each of the openings forming the first metal-containing structure 16 shown in FIG. 1. The planarization stops on a topmost surface of the first interconnect dielectric material layer 12. Thus, and if present, the planarization process also removes the first diffusion barrier material from the topmost surface of the first interconnect dielectric material layer 12. The remaining portion of the first diffusion barrier material that is present in the at least one opening is referred to herein as the first diffusion barrier liner 14, while the remaining first interconnect metal or metal alloy that is present in the at least one opening may be referred to as the first metal-containing structure 16. Collectively, the first interconnect dielectric material layer 12, each optional first diffusion barrier liner 14, and each first metal-containing structure 16 define the lower interconnect level, $L_n$, of an interconnect structure of the present application.

In some embodiments, dielectric capping layer 18 can be formed on the physically exposed topmost surface of the lower interconnect level, $L_n$, of the present application. In other embodiments, dielectric capping layer 18 can be omitted. When present, the dielectric capping layer 18 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The capping material that provides the dielectric capping layer 18 may be formed utilizing a deposition process such as, for example, CVD, PECVD, ALD, chemical solution deposition or evaporation. When present, dielectric capping layer 18 may have a thickness from 10 nm to 100 nm. Other thicknesses that are lesser than 10 nm, or greater than 100 nm may also be used as the thickness of the dielectric capping layer 18.

The second interconnect dielectric material layer 20 (without the combined via/line opening) is formed above the lower interconnect level, $L_n$. The second interconnect dielectric material layer 20 may include one of the interconnect dielectric materials mentioned above for the first interconnect dielectric material layer 12. In some embodiments, the second interconnect dielectric material layer 20 includes a same interconnect dielectric material as the first interconnect dielectric material layer 12. In other embodiments, the second interconnect dielectric material layer 20 includes a different interconnect dielectric material than the first interconnect dielectric layer 12. The second interconnect dielectric material layer 20 may be porous or non-porous, have a thickness within the thickness range of the first interconnect dielectric material layer 12, and be formed utilizing one of the deposition processes used in providing the first interconnect dielectric material layer 12.

A combined via/line opening 22 (opening 22 can also be referred to herein as a dual damascene opening) can then be formed into the second interconnect dielectric material layer 20. During or, after, the formation of the via portion of the combined via opening 22, the capping layer 18 can be opened as is shown in FIG. 1 to expose a portion of the topmost surface of the at least one first metal-containing structure 16. In embodiments in which n is 0, the via portion of the combined via/line opening 22 can physically expose a conductive material or conductive region of one of the semiconductor devices that is formed upon or within a semiconductor substrate. The combined via/line opening 22 is formed utilizing a dual damascene process as known in the art. As is shown in FIG. 1, the line portion of the combined via/line opening 22 is located above the via portion of the combined via/line opening 22.

Figure 2:
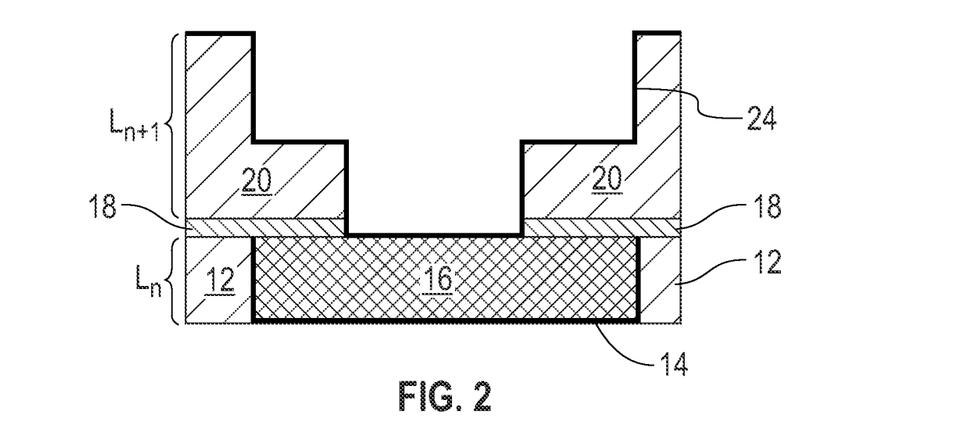
FIG. 2 is a cross sectional view of the exemplary BEOL interconnect structure of FIG. 1 after forming a diffusion barrier material layer in the combined via/line opening and on a topmost surface of the second interconnect dielectric material layer.

Referring now to FIG. 2, there is illustrated the exemplary BEOL interconnect structure of FIG. 1 after forming a diffusion barrier material layer 24 in the combined via/line opening 22 and on a topmost surface of the second interconnect dielectric material layer 20. In the illustrated embodiment, the diffusion barrier material layer 24 includes a second diffusion barrier material which may include one of the diffusion barrier materials mentioned above for the first diffusion barrier material. In one embodiment, the first and second diffusion barrier materials may be composed of a same diffusion barrier material. In another embodiment, the first and second diffusion barrier materials are composed of different diffusion barrier materials. The second diffusion barrier material that provides diffusion barrier material layer 24 may be formed utilizing one of the deposition processes mentioned above for forming the first diffusion barrier material, and the second diffusion barrier material that provides diffusion barrier material layer 24 may have a thickness within the thickness range mentioned above for the first diffusion barrier material.

Figure 3:
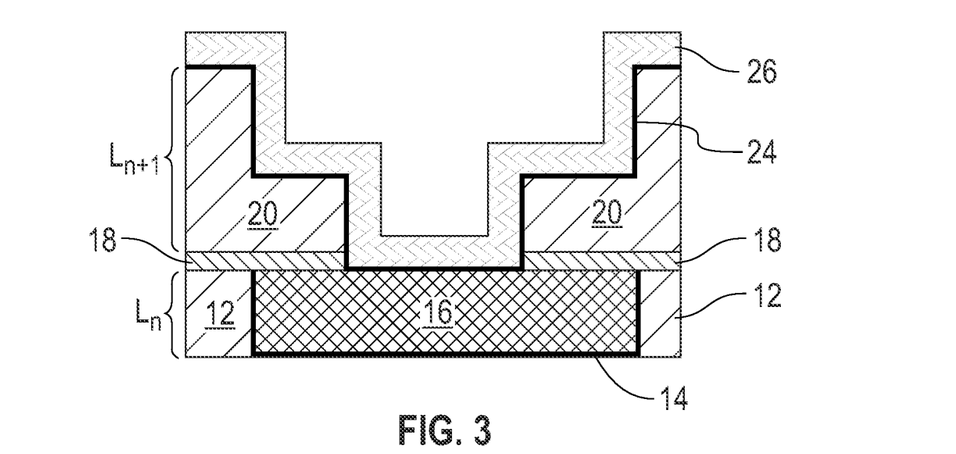
FIG. 3 is a cross sectional view of the exemplary BEOL interconnect structure of FIG. 2 after depositing a first metal layer on the diffusion barrier material layer.

Referring now to FIG. 3, there is illustrated the exemplary BEOL interconnect structure of FIG. 2 after depositing a first metal layer 26 on the diffusion barrier material layer 24. The first metal layer is composed of a noble metal. By "noble metal" it is meant a metal (e.g., a platinum group metal or other precious or semi-precious metal) that is resistant to corrosion and oxidation in moist air. Examples of noble metals that may be employed in the present application as the first metal layer 26 include ruthenium (Ru), rhodium (Rh), palladium (Pd), silver (Ag), osmium (Os), iridium (Ir), platinum (Pt) and gold (Au).

The thickness of the first metal layer 26 may vary depending on the type of noble metal used as well as the technique used in forming the same. The thickness of the first metal layer 26 may also depend on the feature size. Typically, the first metal layer 26 has a thickness from 1 nm to 50 nm. The first metal layer 26 can be formed by a conventional deposition process including, for example, CVD, PECVD, ALD, PVD, or combination of the same.

At this point of the present application, and as shown in FIG. 3, the first metal layer 26 is a continuous layer that is formed on the entirety of the diffusion barrier material layer 24. Moreover, and as is also shown in FIG. 3, a portion of the first metal layer 26 is present in the combined via/line opening 22 and another portion of the first metal layer 26 extends out of the combined via/line opening 22 and is present in the field region of the BEOL interconnect structure. The first metal layer 26 does not completely fill in the combined via/line opening 22.

The first metal layer 26 has a slow polishing rate and thus the thick overburden portion (i.e., the portion of the first metal layer 26 that is outside the combined via/line opening 22) is hard to remove. In conventional processes in which only a noble metal is formed in the combined via/line opening, the slow polishing rate of the noble metal may lead to macro-to-macro variation and/or center-to edge variation.

Figure 4:
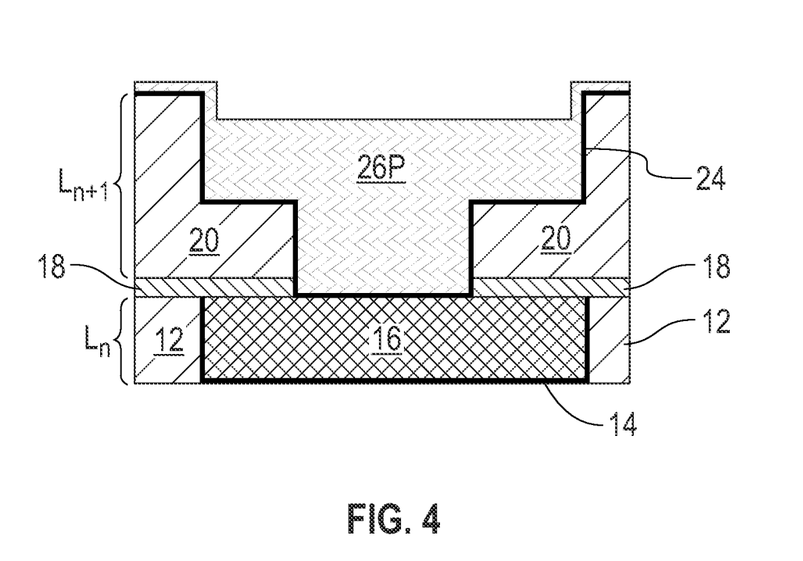
FIG. 4 is a cross sectional view of the exemplary BEOL interconnect structure of FIG. 3 after performing a reflow anneal process which reflows the first metal layer to provide a first metal layer portion.

Referring now to FIG. 4, there is illustrated the exemplary BEOL interconnect structure of FIG. 3 after performing a reflow anneal process which reflows the first metal layer 26 to provide a first metal layer portion 26P. The first metal layer portion 26P is present in the entirety of the via portion of the combined via/line opening 22 as well as a lower portion of the line portion of the combined via/line opening 22; a thin portion of the first metal layer portion 26P (as compared to the originally deposited first metal layer 26) is present within the field region of the BEOL interconnect structure.

The reflow anneal process that can be used in the present application may include a furnace anneal or a laser anneal; laser annealing is typically performed for a shorter period of time than furnace anneal. The reflow anneal process is performed at a temperature in which surface diffusion dominated reflow of the first metal layer 26 occurs with capillary driving force. In such a surface diffusion dominated reflow process, the majority of the first metal layer 26 is pulled into the combined via/line opening 22 and only a thin portion is left in the field region. In one embodiment of the present application, the reflow anneal is performed at a temperature from 150° C. to 700° C. Other reflow anneal temperature may be used as long as the reflow anneal temperature that is selected is capable of performing surface diffusion dominated reflow of the first metal layer 26. The surface diffusion dominated reflow anneal is used to reduce the thickness of a noble metal layer (i.e., the first metal layer 26) outside the combined via/line opening 22 thus reducing or eliminating the burden of polishing the noble metal layer (i.e., the first metal layer 26).

Figure 5:
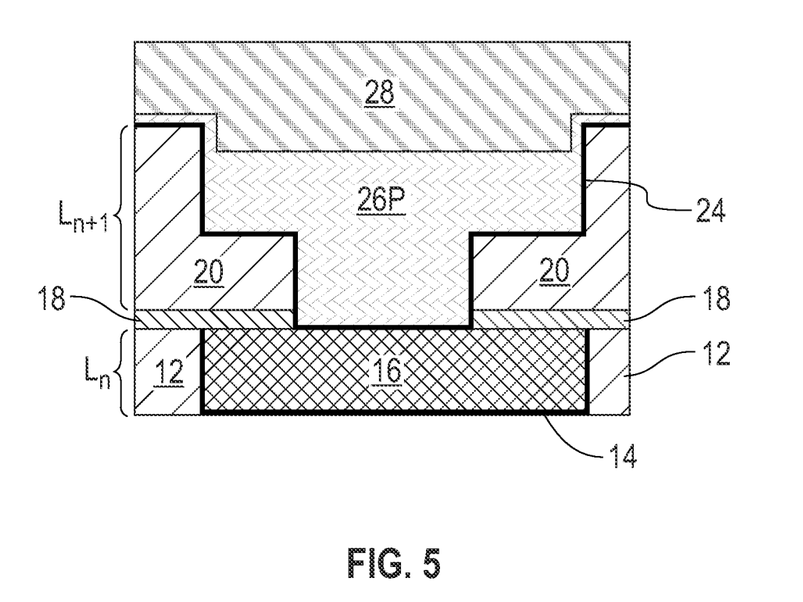
FIG. 5 is a cross sectional view of the exemplary BEOL interconnect structure of FIG. 4 after forming a second metal layer on the first metal layer portion.

Referring now to FIG. 5, there is illustrated the exemplary BEOL interconnect structure of FIG. 4 after forming a second metal layer 28 on the reflow first metal layer portion 24P. As is shown, the second metal layer 28 is formed on the entirety of the first metal layer portion 26P and a portion of the second metal layer 28 is present in an upper portion of the line portion of the combined via/line opening 22.

The second metal layer 28 is composed of a metal that is less noble than the first metal layer 26. That is, the metal that provides the second metal layer 28 has a lower electrode potential (i.e., more negative) than the noble metals that provide the first metal layer 26. In the present application, the second metal layer 28 is composed of a metal having a lower electrode potential than Ru, while the first metal layer 28 is composed of a noble metal having an electrode potential that is equal to, or greater than, Ru. Examples of metals that may be used as the second metal layer 28 include copper (Cu), cobalt (Co), tantalum (Ta), titanium (Ti), aluminum (Al) and tungsten (W).

The metal that provides the second metal layer 28 is easier to remove during a subsequently performed polishing process (i.e., planarization) than the noble metal that provides the first metal layer 26. The use of the second metal layer 28, in combination with the surface diffusion dominated reflow anneal may provide enhanced reduction, and in some embodiments, elimination, of macro-to-macro variation and/or center-to edge variation polishing issues.

The thickness of the second metal layer 28 may vary depending on the type of metal used as well as the technique used in forming the same. Typically, the second metal layer 28 has a thickness from 5 nm to 500 nm. The second metal layer 28 can be formed by a conventional deposition process including, for example, CVD, PECVD, ALD, or PVD.

Figure 6A:
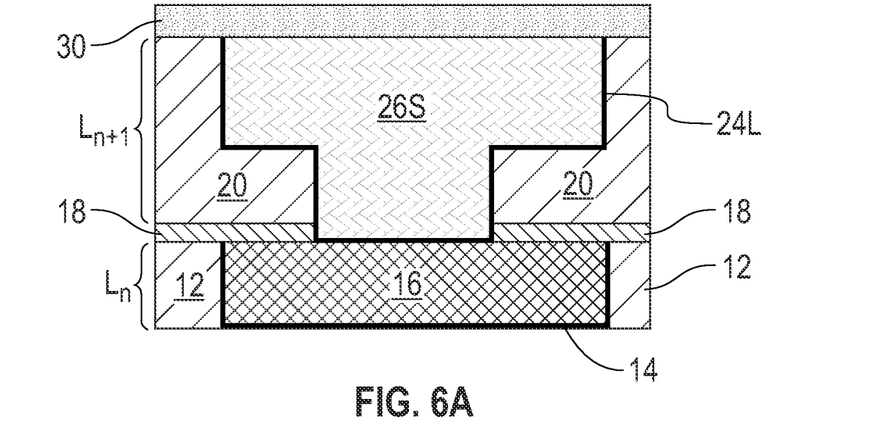
FIG. 6A is a cross sectional view of the exemplary BEOL interconnect structure of FIG. 5 after performing a planarization process and formation of a dielectric capping layer in accordance with a first embodiment of the present application.

Referring now to FIG. 6A, there is illustrated the exemplary BEOL interconnect structure of FIG. 5 after performing a planarization (i.e., polishing) process and formation of a dielectric capping layer 30 in accordance with a first embodiment of the present application. The planarization process that can be used in the present application may include chemical mechanical polishing and/or grinding. In this embodiment, the planarization process removes an upper portion of the second interconnect dielectric material layer 20 as well as the entirety of the second metal layer 28, a portion of the first metal layer portion 26, and a portion of the second diffusion barrier material layer 24 to provide the exemplary BEOL interconnect structure shown in FIG. 6A. The remaining portion of the first metal layer portion 26P constitutes a first metal structure 26S that is composed of one of the aforementioned noble metals. The remaining portion of the diffusion barrier material layer 24 constitutes a second diffusion barrier liner 24L of the exemplified BEOL interconnect structure.

In this embodiment, the first metal structure 26S and the second diffusion barrier liner 24L are the only elements present in the combined via/line opening 22. In this embodiment, the first metal structure 26 has a topmost surface that is coplanar with topmost surfaces of the second diffusion barrier liner 24L and with a topmost surface of the remaining portion of the second interconnect dielectric material layer 20.

Dielectric capping layer 30 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC (N,H)) or a multilayered stack of at least one of the aforementioned dielectric capping materials. The capping material that provides dielectric capping layer 30 may be formed utilizing a deposition process such as, for example, CVD, PECVD, ALD, chemical solution deposition or evaporation. Dielectric capping layer 30 may have a thickness from 10 nm to 100 nm. Other thicknesses that are lesser than 10 nm, or greater than 100 nm may also be used as the thickness of the dielectric capping layer 30.

In this embodiment, the dielectric capping layer 30 is present on the topmost surfaces of the first metal structure 26S, the second diffusion barrier liner 24L, and the second interconnect dielectric material layer 20.

Figure 6B:
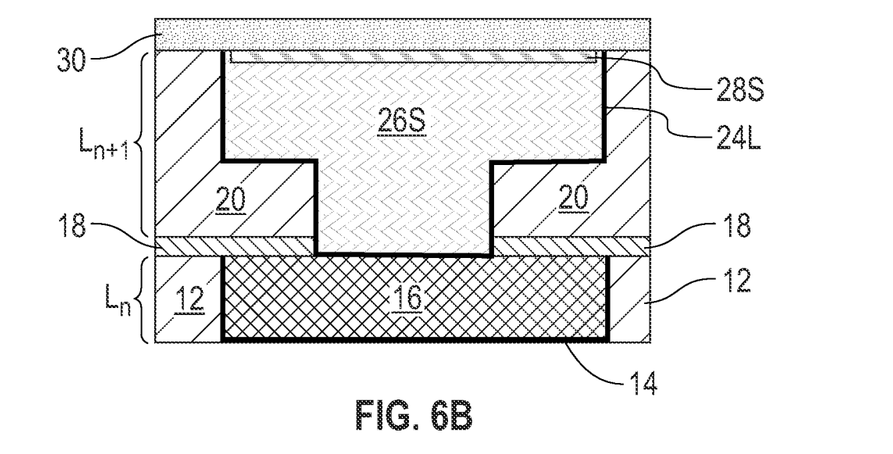
FIG. 6B is a cross sectional view of the exemplary BEOL interconnect structure of FIG. 5 after performing a planarization process and formation of a dielectric capping layer in accordance with a second embodiment of the present application.

Referring now to FIG. 6B, there is illustrated the exemplary BEOL interconnect structure of FIG. 5 after performing a planarization process and formation of a dielectric capping layer 30 in accordance with a second embodiment of the present application. The planarization process may include one of the planarization processed mentioned above in regard to providing the exemplary BEOL interconnect structure of FIG. 6A. The dielectric capping layer 30 that can be used in this embodiment of the present application is the same as defined above in providing the dielectric capping layer 30 shown in FIG. 6A.

In this embodiment of the present application, the planarization process removes a portion of the second metal layer 28, a portion of the first metal layer portion 26, and a portion of the second diffusion barrier material layer 24, stopping on the topmost surface of the second interconnect dielectric material layer 20, to provide the exemplary BEOL interconnect structure shown in FIG. 6B. The remaining portion of the second metal layer constituents a second metal structure 28S that is composed of a metal that is less noble than the metal of the first metal layer 24. The remaining portion of the first metal layer portion 26P constitutes a first metal structure 26S that is composed of one of the aforementioned noble metals. The remaining portion of the diffusion barrier material layer 24 constitutes a second diffusion barrier liner 24L of the exemplified BEOL interconnect structure.

In this embodiment, the second metal structure 28P, the first metal structure 26S and the second diffusion barrier liner 24L are the only elements present in the combined via/line opening 22. In this embodiment, the first metal structure 26S has vertical extending portions that surround sidewalls of the second metal structure 28S. In this embodiment, the first metal structure 26S has topmost surfaces that are coplanar with a topmost surface of the second metal structure 28S, the second diffusion barrier liner 24L and the second interconnect dielectric material layer 20. In this embodiment, the dielectric capping layer 30 is present on exposed topmost surfaces of the first and second metal structures (26S, 28S, respectively), the second diffusion barrier liner 24L and the topmost surface of the second interconnect dielectric material layer 20.

Figure 6C:
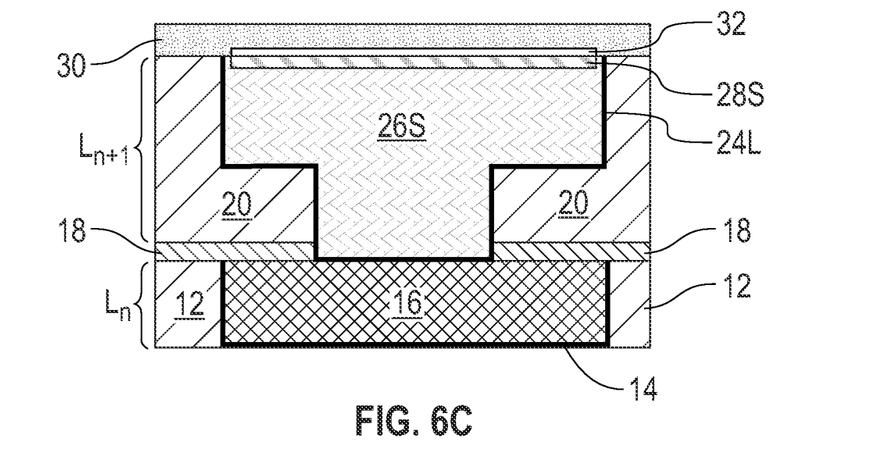
FIG. 6C is a cross sectional view of the exemplary BEOL interconnect structure of FIG. 5 after performing a planarization process and formation of a selective metal cap and a dielectric capping layer in accordance with a third embodiment of the present application.

Referring now to FIG. 6C, there is illustrated the exemplary BEOL interconnect structure of FIG. 5 after performing a planarization process and formation of a selective metal cap 32 and a dielectric capping layer 30 in accordance with a third embodiment of the present application. The planarization process may include one of the planarization processed mentioned above in regard to providing the exemplary BEOL interconnect structure of FIG. 6A. The dielectric capping layer 30 that can be used in this embodiment of the present application is the same as defined above in providing the dielectric capping layer 30 shown in FIG. 6A.

In this embodiment of the present application, the planarization process removes a portion of the second metal layer 28, a portion of the first metal layer portion 26, and a portion of the second diffusion barrier material layer 24, stopping on the topmost surface of the second interconnect dielectric material layer 20, to provide the exemplary BEOL interconnect structure shown in FIG. 6C. The remaining portion of the second metal layer constituents a second metal structure 28S that is composed of a metal that is less noble than the metal of the first metal layer 24. The remaining portion of the first metal layer portion 26P constitutes a first metal structure 26S that is composed of one of the aforementioned noble metals. The remaining portion of the diffusion barrier material layer 24 constitutes a second diffusion barrier liner 24L of the exemplified BEOL interconnect structure.

In this embodiment, the second metal structure 28P, the first metal structure 26S and the second diffusion barrier liner 24L are the only elements present in the combined via/line opening 22. In this embodiment, the first metal structure 26S has vertical extending portions that surround sidewalls of the second metal structure 28S. In this embodiment, the first metal structure 26S has topmost surfaces that are coplanar with a topmost surface of the second metal structure 28S, the second diffusion barrier liner 24L and the second interconnect dielectric material layer 20.

In this embodiment, selective metal cap 32 is formed only on the topmost surface of the second metal structure 28S. The presence of the selective metal cap 32 may provide enhanced electromigration resistance to the BEOL interconnect structure. The selective metal cap 32 has a different metal composition than the second metal layer 28. In one embodiment, the selective metal cap 32 may be composed of Co, Ru, Ta, Ti, W or alloys thereof such as, for example, a CoW alloy. The selective metal cap 32 may be formed utilizing a selective deposition process such as, for example, CVD, ALD, electroless plating of any combination of the same. The selective metal cap 32 may have a thickness from 1 nm to 20 nm; other thicknesses are possible for the selective metal cap 32 and thus are not excluded from being used.

In this embodiment, the dielectric capping layer 30 is present on exposed topmost surfaces of the selective metal cap 32, the first metal structures 26S, the second diffusion barrier liner 24L and the topmost surface of the second interconnect dielectric material layer 20.

Figure 6D:
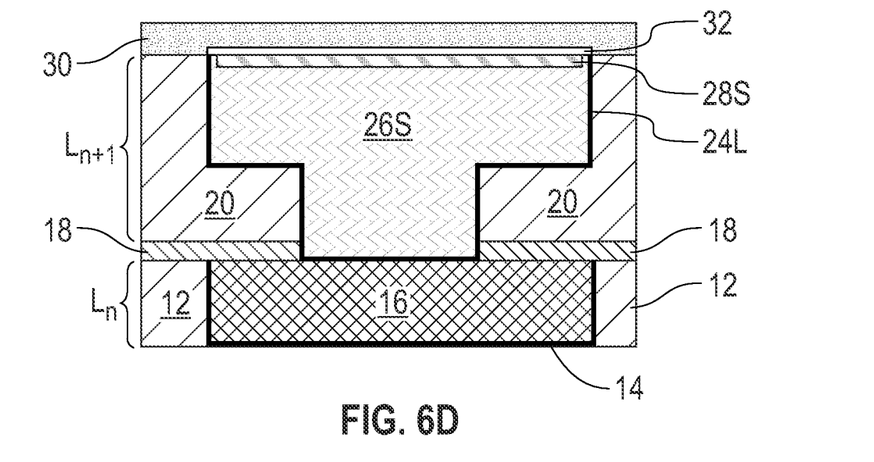
FIG. 6D is a cross sectional view of the exemplary BEOL interconnect structure of FIG. 5 after performing a planarization process and formation of a selective metal cap and a dielectric capping layer in accordance with a fourth embodiment of the present application.

Referring now to FIG. 6D, there is illustrated the exemplary BEOL interconnect structure of FIG. 5 after performing a planarization process and formation of a selective metal cap 32 and a dielectric capping layer 30 in accordance with a fourth embodiment of the present application. The planarization process may include one of the planarization processed mentioned above in regard to providing the exemplary BEOL interconnect structure of FIG. 6A. The dielectric capping layer 30 that can be used in this embodiment of the present application is the same as defined above in providing the dielectric capping layer 30 shown in FIG. 6A.

In this embodiment of the present application, the planarization process removes a portion of the second metal layer 28, a portion of the first metal layer portion 26, and a portion of the second diffusion barrier material layer 24, stopping on the topmost surface of the second interconnect dielectric material layer 20, to provide the exemplary BEOL interconnect structure shown in FIG. 6C. The remaining portion of the second metal layer constituents a second metal structure 28S that is composed of a metal that is less noble than the metal of the first metal layer 24. The remaining portion of the first metal layer portion 26P constitutes a first metal structure 26S that is composed of one of the aforementioned noble metals. The remaining portion of the diffusion barrier material layer 24 constitutes a second diffusion barrier liner 24L of the exemplified BEOL interconnect structure.

In this embodiment, the second metal structure 28P, the first metal structure 26S and the second diffusion barrier liner 24L are the only elements present in the combined via/line opening 22. In this embodiment, the first metal structure 26S has vertical extending portions that surround sidewalls of the second metal structure 28S. In this embodiment, the first metal structure 26S has topmost surfaces that are coplanar with a topmost surface of the second metal structure 28S, the second diffusion barrier liner 24L and the second interconnect dielectric material layer 20.

In this embodiment, selective metal cap 32 is formed on the topmost surfaces of the second metal structure 28S, the first metal structure 26S and the second diffusion barrier liner 24L. The presence of the selective metal cap 32 may provide enhanced electromigration resistance to the BEOL interconnect structure. The selective metal cap 32 has a different metal composition than the second metal layer 28. In one embodiment, the selective metal cap 32 may be composed of Co, Ru, Ta, Ti, W or alloys thereof such as, for example, a CoW alloy. The selective metal cap 32 may be formed utilizing a selective deposition process such as, for example, CVD, ALD, electroless plating of any combination of the same. The selective metal cap 32 may have a thickness from 1 nm to 20 nm; other thicknesses are possible for the selective metal cap 32 and thus are not excluded from being used.

In this embodiment, the dielectric capping layer 30 is present on physically exposed topmost surfaces of the selective metal cap 32 and the topmost surface of the second interconnect dielectric material layer 20.

FIGS. 6B, 6C and 6B illustrate BEOL interconnect structures of the present application that include an interconnect level, $L_{n+1}$, comprising an interconnect dielectric material layer 20 having a combined via/line opening 22 located therein. A first metal structure 26S composed of a noble metal is present in the combined via/line opening 22. A second metal structure 28S composed of a metal that is less noble than the noble metal is present in an upper portion the combined via/line opening 22 and is in direct physical contact with the first metal structure 26S. In accordance with the present application, a portion of the first metal structure 26S is located on each sidewall surface of the second metal structure 28S.

Figure 7:
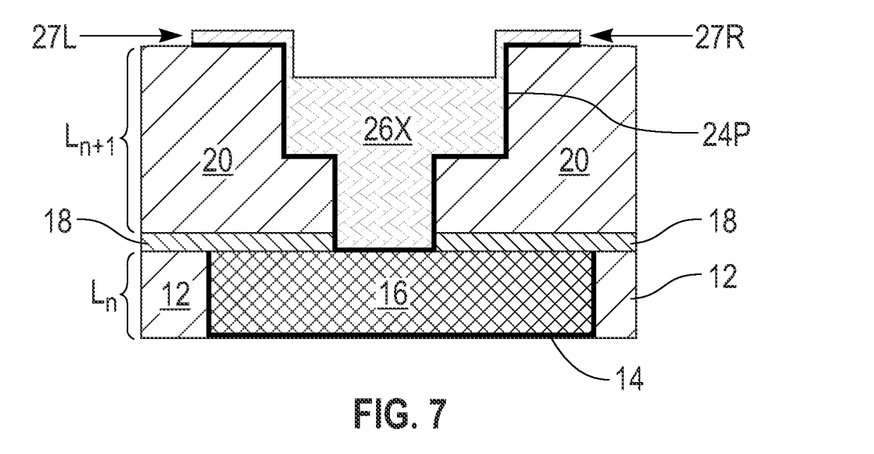
FIG. 7 is a cross sectional view of the exemplary BEOL interconnect structure of FIG. 4 after patterning the first metal layer portion to provide a patterned first metal structure including fuse elements in accordance with alternative embodiment of the present application.

Referring now to FIG. 7, there is illustrated the exemplary BEOL interconnect structure of FIG. 4 after patterning the first metal layer portion 26P to provide a patterned metal structure 26X including fuse elements 27L, 27R in accordance with alternative embodiment of the present application. During the patterning of the first metal layer portion 26, the diffusion barrier material layer 24 is also patterned; in the drawings elements 24P denotes a patterned diffusion barrier layer.

The metal structure 26X including fuse elements 27L, 27R is composed of one of the aforementioned noble metals. The fuse elements 27L, 27R of the metal structure 26X are present on the topmost surface of the second interconnect dielectric material layer 20. The fuse elements 27L, 27R have a thickness from 1 nm to 100 nm. The metal structure 26X that is within the combined via/line opening 22 has a portion that has an upper surface that is recessed relative to the topmost surface of the second interconnect dielectric material layer 20. In this embodiment of the present application, the patterning of the first metal layer portion 26P as well as the diffusion barrier material layer 24 may be performed by lithography and etching.

Figure 8:
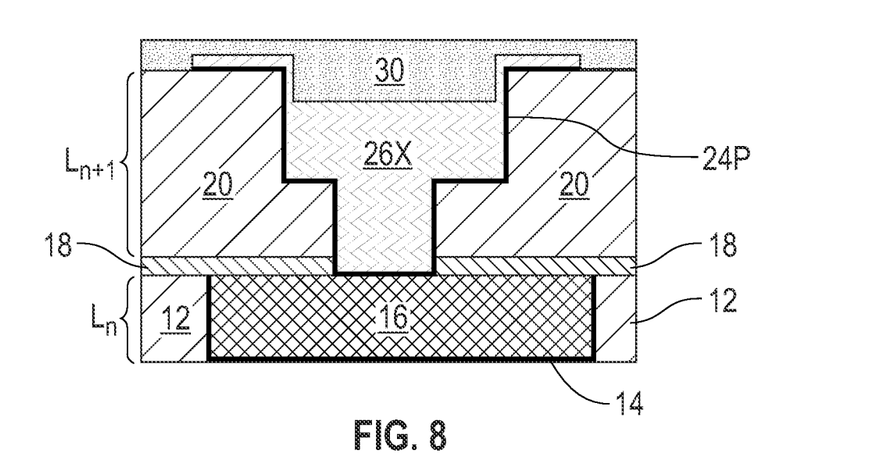
FIG. 8 is a cross sectional view of the exemplary BEOL interconnect structure of FIG. 7 after forming a dielectric capping layer.

Referring now to FIG. 8, there is illustrated the exemplary BEOL interconnect structure of FIG. 7 after forming a dielectric capping layer 30. Dielectric capping layer 30 of this embodiment of the present application is the same as dielectric capping layer 30 disclosed in the previous embodiments of the present application. As is shown, the dielectric capping layer 30 is formed on exposed surfaces of the metal structure 26X including fuse elements 27L, 27R. The dielectric capping layer 30 covers sidewall surfaces of the fuse elements 27L, 27S, and sidewall surfaces of the patterned diffusion barrier layer 24P.

Figure 9:
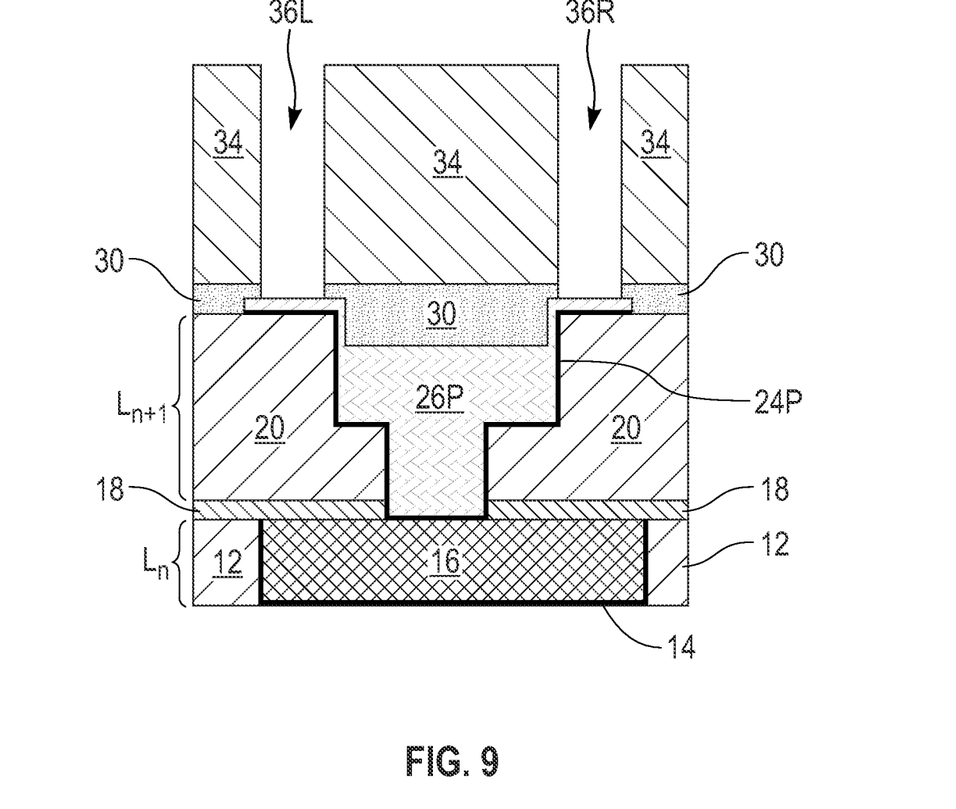
FIG. 9 is a cross sectional view of the exemplary BEOL interconnect structure of FIG. 8 after forming a third interconnect dielectric material layer and forming fuse element contact openings in the third interconnect dielectric material layer which extend to a surface of each fuse element of the patterned first metal structure.

Referring now to FIG. 9, there is illustrated the exemplary BEOL interconnect structure of FIG. 8 after forming a third interconnect dielectric material layer 34 and forming fuse element contact openings 36L, 36R in the third interconnect dielectric material layer 34 which extend to a surface of each fuse element 27L, 27R of the patterned first metal structure 26X. The third interconnect dielectric material layer 34 defines another interconnect level, i.e., $L_{n+2}$, of the present application.

Third interconnect dielectric material layer 34 may include one of the interconnect dielectric materials mentioned above for the first interconnect dielectric material layer 12. The third interconnect dielectric material layer 34 may be composed of an interconnect dielectric material that is the same as, or different from the first and/or second interconnect dielectric material layers (12, 20, respectively). The third interconnect dielectric material layer 34 may be porous or non-porous, have a thickness within the thickness range of the first interconnect dielectric material layer 12, and be formed utilizing one of the deposition processes used in providing the first interconnect dielectric material layer 12. The fuse element contact openings 36L, 36R may be formed by lithography and etching.

Figure 10:
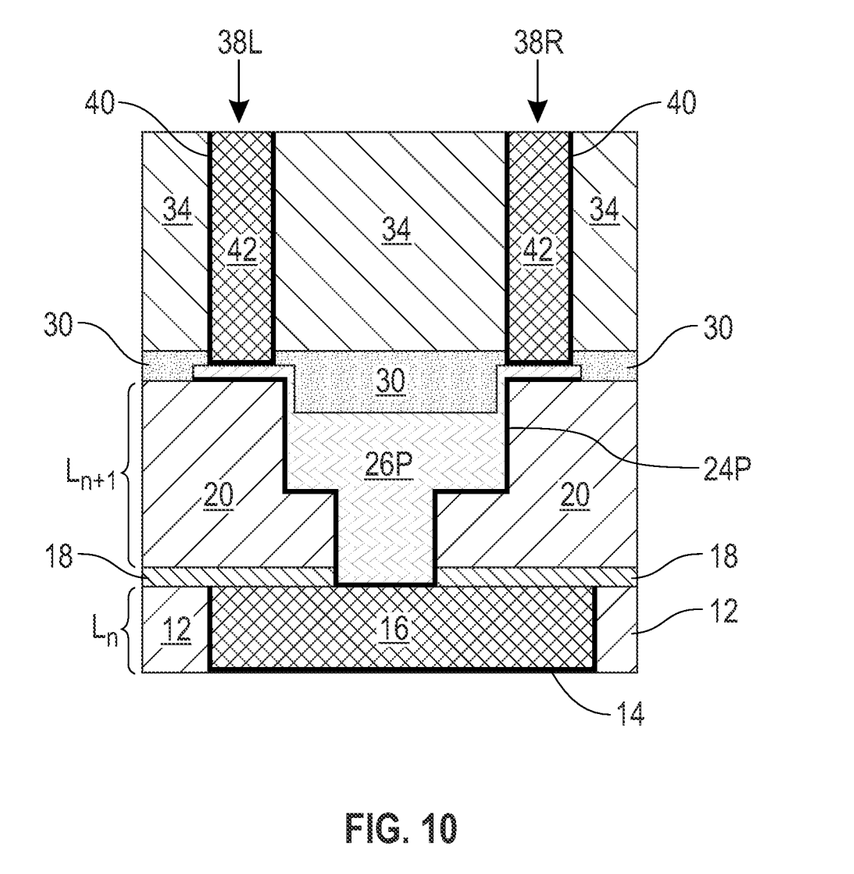
FIG. 10 is a cross sectional view of the exemplary BEOL interconnect structure of FIG. 9 after forming a fuse element contact structure in each fuse element contact opening.

Referring now to FIG. 10, there is illustrated the exemplary BEOL interconnect structure of FIG. 9 after forming a fuse element contact structure 38L 38R in each fuse element contact opening 36L, 36R. Each fuse element contact structure 38L 38R includes a diffusion barrier liner 40 and a contact metal structure 42. The diffusion barrier liner 40 may include one of the diffusion barrier materials mentioned above for first diffusion barrier liner 14. The contact metal structure 42 may include a contact metal such as, for example, copper, tungsten, cobalt, aluminum or alloys thereof.

Each fuse element contact structure 38L 38R can be formed by forming a diffusion barrier material and a contact metal or metal alloy within each fuse element contact opening 36L, 36R, and thereafter performing a planarization process.

Figure 11:
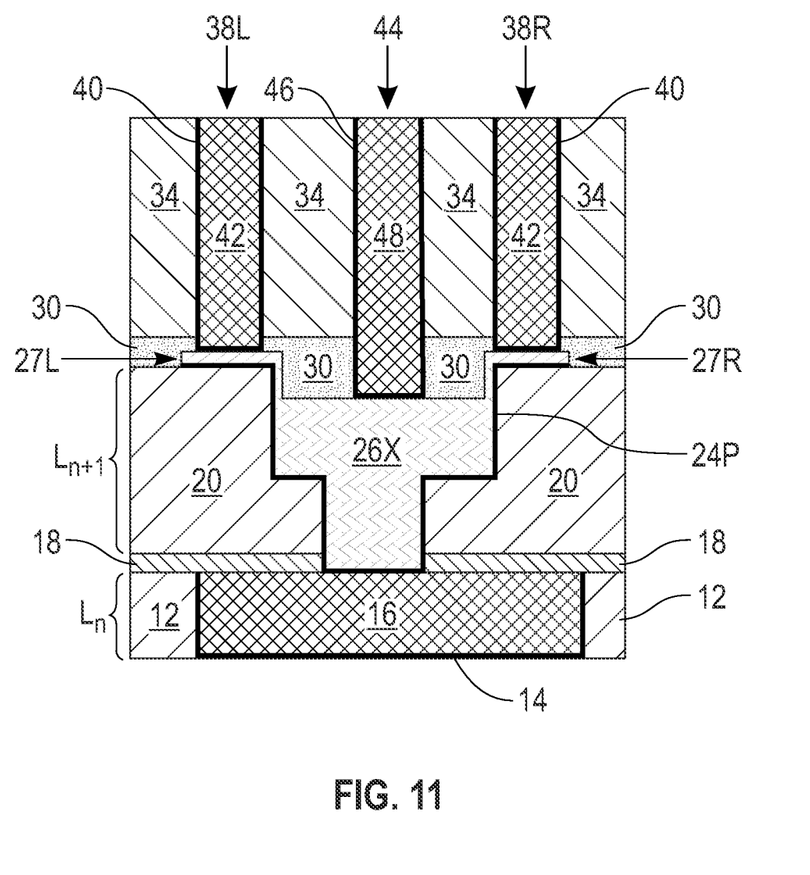
FIG. 11 is a cross sectional view of the exemplary BEOL interconnect structure of FIG. 10 after forming a non-fuse element contact opening in the third interconnect dielectric material layer which extends to a surface of the patterned first metal structure in the line portion of the combined via/line opening, and forming a non-fuse element contact structure within the non-fuse element contact opening.

Referring now to FIG. 11, there is illustrated the exemplary BEOL interconnect structure of FIG. 10 forming a non-fuse element contact opening in the third interconnect dielectric material layer 34 which extends to a surface of the patterned metal structure 24X in the line portion of the combined via/line opening 22, and forming a non-fuse element contact structure 44 within the non-fuse element contact opening. The non-fuse element contact opening can be formed by lithography and etching. The non-fuse element contact structure 44 includes a diffusion barrier liner 46 and a contact metal structure 48.

The diffusion barrier liner 46 may include one of the diffusion barrier materials mentioned above for first diffusion barrier liner 14. The contact metal structure 48 may include a contact metal such as, for example, copper, tungsten, cobalt, aluminum or alloys thereof.

The non-fuse element contact structure 44 can be formed by forming a diffusion barrier material and a contact metal or metal alloy within each non-fuse element contact opening and thereafter performing a planarization process. In some embodiments, the non-fuse element contact structure 44 may be formed prior to the fuse element contact structures 38L, 38R. In yet other embodiments, the non-fuse element contact structure 44 may be formed as the same time as the fuse element contact structures 38L, 38R.

In another embodiment of the present application, the BEOL interconnect structure includes a metal structure 26X composed of a noble metal present in a combined via/line opening 22 that is present in a lower interconnect dielectric material layer 20, wherein the metal structure 26X has fuse elements 27L, 26R that are present above a topmost surface of the lower interconnect dielectric material layer 20. An upper interconnect dielectric material layer 32 is located above the lower interconnect dielectric material layer 20. The upper interconnect dielectric material layer 32 includes a fuse element contact structure (38L, 38R) contacting each fuse element (27L, 27R) and a non-fuse element contact structure 44 contacting a surface of the metal structure 26X that is located in the combined via/line opening 22 present in the lower interconnect dielectric material layer 20.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A back-end-of-the line (BEOL) interconnect structure comprising:
   a first metal structure composed of a noble metal and present in a combined via/line opening of an interconnect dielectric material layer, wherein the noble metal is selected from the group consisting of rhodium (Rh), palladium (Pd), silver (Ag), osmium (Os), iridium (Ir), platinum (Pt) and gold (Au);
   a second metal structure composed of a metal that is less noble than the noble metal present in an upper portion of the combined via/line opening and in direct physical contact with the first metal structure, wherein the metal that provides the second metal structure is selected from the group consisting of copper (Cu), cobalt (Co), tantalum (Ta), titanium (Ti), aluminum (Al) and tungsten (W), and a portion of the first metal structure is located on each sidewall surface of the second metal structure;
   a selective metal cap having a different metal composition than the second metal structure located entirely on the second metal structure, wherein the selective metal cap has an outermost sidewall that is vertically aligned with an outermost sidewall of the second metal structure; and
   an upper dielectric capping layer located on the interconnect dielectric material layer and a portion of the first metal structure, wherein a lower portion of the upper dielectric capping layer embeds the selective metal cap.

2. The BEOL interconnect structure of claim 1, wherein the second metal structure has a topmost surface that is coplanar with a topmost surface of the first metal structure and a topmost surface of the interconnect dielectric material layer.

3. The BEOL interconnect structure of claim 1, further comprising a diffusion barrier liner in the combined via/line opening and located on the sidewalls and a bottommost surface of the first metal structure.

4. The BEOL interconnect structure of claim 3, wherein the diffusion barrier liner has a topmost surface that is coplanar with a topmost surface of each of the first and second metal structures and with a topmost surface of the interconnect dielectric material layer.

5. The BEOL interconnect structure of claim 1, wherein the metal that provides the second metal structure has a lower electrode potential than ruthenium.

6. The BEOL interconnect structure of claim 1, wherein a lower portion of the first metal structure that is present in a via portion of the combined via/line opening has a width that is less than a width of an upper portion of the first metal structure that is present in a line portion of the combined via/line opening.

7. The BEOL interconnect structure of claim 1, wherein the first metal structure and the interconnect dielectric material layer are located above a lower interconnect level, the lower interconnect level comprising a lower metal structure embedded in a lower interconnect dielectric material layer.

8. The BEOL interconnect structure of claim 7, further comprising a lower dielectric capping layer located between the lower interconnect dielectric material layer and the interconnect dielectric material layer.

9. The BEOL interconnect structure of claim 1, wherein a line portion of the combined via/line opening is located above a via portion of the combined via/line opening, and the line portion is in communication with the via portion.

* * * * *